(12) United States Patent
Sawada et al.

(10) Patent No.: US 6,383,411 B1
(45) Date of Patent: May 7, 2002

(54) PIEZOELECTRIC CERAMIC COMPOSITION AND PIEZOELECTRIC CERAMIC DEVICE USING THE SAME

(75) Inventors: Takuya Sawada, Moriyama; Masahiko Kimura, Kusatsu; Akira Ando, Omihachiman; Koichi Hayashi, Shiga-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 10 days.

(21) Appl. No.: 09/639,593

(22) Filed: Aug. 16, 2000

(30) Foreign Application Priority Data

Aug. 26, 1999 (JP) .............................. 11-240145
May 31, 2000 (JP) ........................ 2000-161831

(51) Int. Cl.[7] .......................... H01B 3/12; H01G 21/12; H01L 41/00; H03H 9/00
(52) U.S. Cl. ............................. 252/202.9 R; 501/134; 501/135
(58) Field of Search .................... 252/62.9 R; 501/134, 501/135

(56) References Cited

U.S. PATENT DOCUMENTS 6,117,354 A * 9/2000 Kimura et al. ............... 501/135
6,258,291 B1 * 7/2001 Kimura et al. ............... 501/135

* cited by examiner

*Primary Examiner*—C. Melissa Koslow
(74) *Attorney, Agent, or Firm*—Ostrolenk, Faber, Gerb & Soffen, LLP

(57) ABSTRACT

A piezoelectric ceramic composition mainly contains a component of the formula $SrBi_2Nb_2O_9$ and includes Si in a proportion of more than 0 mol and equal to or less than about 0.3 mol relative to 1 mol of Bi in the main component of the formula. This piezoelectric ceramic composition can be fired at lower temperatures, exhibits a practicable electromechanical coefficient kt even when fired at firing temperatures of 1100 ° C. or less, and is useful as materials for piezoelectric ceramic filters, piezoelectric ceramic oscillators, piezoelectric ceramic resonators, and other piezoelectric ceramic devices. By using the piezoelectric ceramic composition, satisfactory piezoelectric ceramics can be obtained.

20 Claims, 1 Drawing Sheet

PIEZOELECTRIC CERAMIC COMPOSITION AND PIEZOELECTRIC CERAMIC DEVICE USING THE SAME

BACKGROUND OF THE INVENTION

1. Field of the Invention

The present invention relates to piezoelectric ceramic compositions and piezoelectric ceramic devices using the compositions. Particularly, the present invention relates to piezoelectric ceramic compositions which are useful as materials for, for example, piezoelectric ceramic filters, piezoelectric ceramic oscillators, piezoelectric ceramic resonators and other piezoelectric ceramic devices, and to piezoelectric ceramic devices using the compositions.

2. Description of the Related Art

Piezoelectric ceramic compositions mainly containing lead titanate zirconate ($Pb(Ti_xZr_{1-x})O_3$) or lead titanate ($PbTiO_3$) have been widely used as piezoelectric ceramic compositions for piezoelectric ceramic filters, piezoelectric ceramic oscillators, piezoelectric ceramic resonators and other piezoelectric ceramic devices. However, such piezoelectric ceramic compositions mainly containing lead titanate zirconate or lead titanate inevitably contain large amounts of lead as a component, and lead oxide evaporates in the production of the piezoelectric ceramics to deteriorate the uniformity of characteristics of the produced devices. To avoid deteriorated uniformity of characteristics of the produced devices due to vaporization of lead oxide in the production step, piezoelectric ceramic compositions containing no or small amounts of lead are preferred.

In contrast, piezoelectric ceramic compositions mainly containing $SrBi_2Nb_2O_9$ or other layered bismuth compounds include no lead oxides in the composition and do not invite the above problem.

However, piezoelectric ceramic compositions mainly containing $SrBi_2Nb_2O_9$ or other layered bismuth compounds must be fired at high temperatures of 1250° C. or more to obtain piezoelectric ceramics exhibiting a practicable electromechanical coefficient kt (10% or more). Expensive kilns that can perform firing at such high temperatures are therefore required. In piezoelectric ceramic filters or other piezoelectric ceramic devices having inner electrodes, electrode materials should have a melting point higher than the firing temperature. Such piezoelectric ceramic devices therefore require expensive electrode materials such as platinum or palladium, which invites increased production costs.

SUMMARY OF THE INVENTION

Accordingly, it is a main object of the invention to provide piezoelectric ceramic compositions mainly containing $SrBi_2Nb_2O_9$ which can be fired at lower temperatures, exhibit a practicable electromechanical coefficient kt even when fired at firing temperatures of 1100° C. or less, and which are useful as materials for, for example, piezoelectric ceramic filters, piezoelectric ceramic oscillators, piezoelectric ceramic resonators and other piezoelectric ceramic devices, and to provide piezoelectric ceramic devices using the compositions.

The invention provides, in one aspect, a piezoelectric ceramic composition mainly containing a component corresponding to the formula $SrBi_2Nb_2O_9$. The composition includes at least Si in a proportion of more than 0 mol and equal to or less than about 0.3 mol relative to 1 mol of Bi in the main component shown by the formula. The invented piezoelectric ceramic composition may include, for example, a component shown by the formula $SrBi_2(Nb_{1-y}Si_y)_2O_9$, wherein y is more than 0 and equal to or less than 0.3.

The invented piezoelectric ceramic composition may further include a divalent metallic element other than Sr in a proportion of more than 0 mol and equal to or less than about 0.25 mol relative to 1 mol of Bi. In this case, the divalent metallic element other than Sr may be at least one selected from Mg, Ca and Ba.

The invented piezoelectric ceramic composition may further include a trivalent metallic element other than Bi in a proportion of more than 0 mol and equal to or less than about 0.15 mol relative to 1 mol of Bi. In this case, the trivalent metallic element other than Bi may be at least one selected from the group consisting of La, Ce, Pr, Nd, Sm, Gd, Dy, Er, Yb, Sc and Y.

Preferably, the invented piezoelectric ceramic composition may further include manganese in a proportion of more than 0% by weight and equal to or less than about 1.0% by weight in terms of $MnCO_3$.

In another aspect, the invention provides a piezoelectric ceramic device. The piezoelectric ceramic device includes a piezoelectric ceramic composed of the piezoelectric ceramic composition and electrodes formed on the piezoelectric ceramic.

The invented piezoelectric ceramic composition should include Si in a proportion of more than 0 mol and equal to or less than about 0.3 mol relative to 1 mol of Bi. If the content of Si exceeds this range, the electromechanical coefficient kt is decreased and a practically sufficient electromechanical coefficient cannot be significantly obtained.

The invention is also effective for piezoelectric ceramic compositions each containing Mg, Ca, B or another divalent metallic element, or La, Ce, Pr, Nd, Sm, Gd, Dy, Er, Yb, Sc, Y or another trivalent metallic element in the main component. Especially, when the main component includes at least one element selected from La, Ce, Pr, Nd, Sm, Gd, Dy, Er, Yb, Sc, and Y in a proportion of more than 0 mol and equal to or less than about 0.15 mol relative to 1 mol of Bi, the temperature-dependent factor of resonant frequency within a temperature range from −20° C. to 80° C., i.e., frTC shown by the following equation, is decreased, although the reason of this phenomenon is not known.

$$frTC = (fr(max) - fr(min))/(fr(20°\ C.) \times 100)$$

wherein fr(max) is the maximum resonant frequency within the temperature range from −20° C. to 80° C.; fr(min) is the minimum resonant frequency within the temperature range from −20° C. to 80° C.; and fr(20° C.) is the resonant frequency at 20° C.

Accordingly, resulting piezoelectric ceramic compositions can be fired at temperatures of 1100° C. or less, have a practicable electromechanical coefficient and have a low temperature-dependent factor of resonant frequency frTC. These piezoelectric ceramic compositions are useful as, for example, materials for piezoelectric ceramic resonators and other piezoelectric ceramic devices. In this case, the main component should preferably include at least one selected from La, Ce, Pr, Nd, Sm, Gd, Dy, Er, Yb, Sc and Y in a proportion of more than 0 mol and equal to or less than about 0.15 mol relative to 1 mol of Bi. If the content of these elements exceeds the above range, the electromechanical coefficient kt is decreased and the incorporation of these elements does not exhibit satisfactory advantages, as compared with compositions which contain none of the above elements.

The present inventors also found that the electromechanical coefficient can be improved by incorporating manganese in a proportion of about 1.0% by weight or less in terms of $MnCO_3$ into a piezoelectric ceramic composition mainly containing $SrBi_2Nb_2O_9$ (Japanese Patent Application No. 10-156648). The present invention is also effective for this type of piezoelectric ceramic compositions. The resulting piezoelectric ceramic compositions can be fired at temperatures of 1100° C. or less, have a practicable electromechanical coefficient, and are useful as materials for piezoelectric ceramics.

Further objects, features, and advantages of the present invention will become apparent from the following description of the preferred embodiments with reference to the attached drawings.

DESCRIPTION OF THE PREFERRED EMBODIMENTS

EXAMPLE

Figure 1:
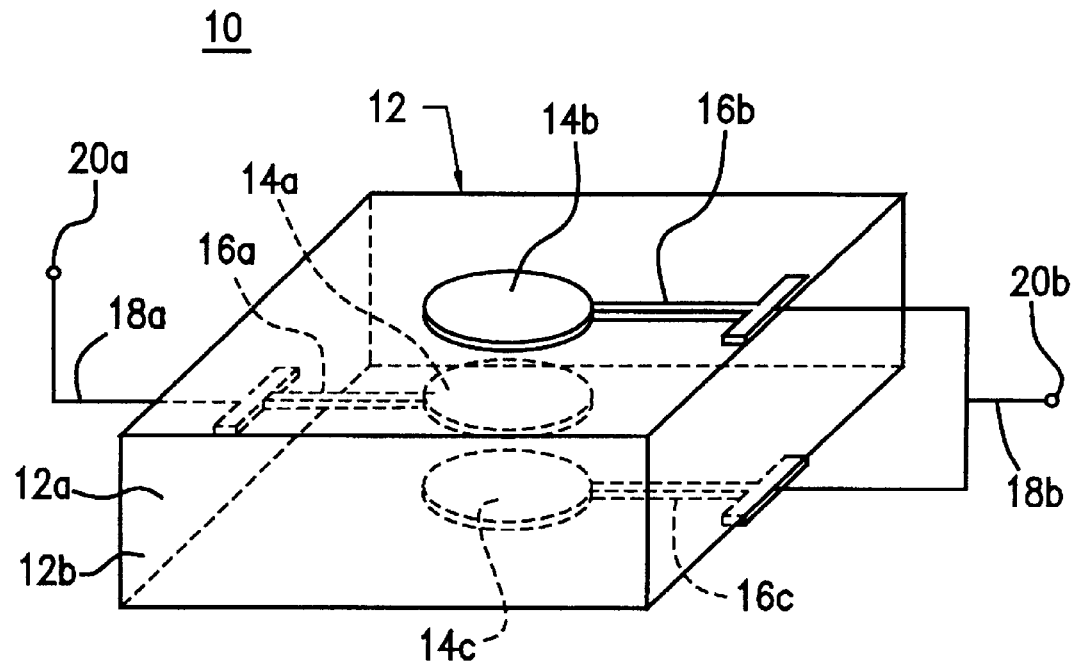
FIG. 1 is a perspective view of an embodiment of the invented piezoelectric ceramic resonator.

Starting materials, $SrCO_3$, $Bi_2O_3$, $Nb_2O_5$, $MgCO_3$, $CaCO_3$, $BaCO_3$, $La_2O_3$, $Nd_2O_3$, $Sm_2O_3$, $Y_2O_3$, $SiO_2$ and $MnCO_3$ were weighed to yield a composition $(Sr_{1-x}M_x)Bi_2(Nb_{1-y}Si_y)_2O_9+z$ % by weight $MnCO_3$, wherein M is one of Mg, Ca, Ba, La, Nd, Sm and Y; y and z satisfy the following conditions: $0 \leq y \leq 0.35$ and $0 \leq z \leq 1.1$; and x satisfies the following conditions: $0 \leq x \leq 0.6$ when M is Mg, Ca or Ba, and $0 \leq x \leq 0.4$ when M is La, Nd, Sm or Y. The weighed materials were wet-mixed in a ball mill for about four hours to yield a mixture. The mixture was dried and was then calcined at 700° C. to 900° C. to yield a calcined product. The calcined product was roughly ground, and was wet-milled with an appropriate amount of an organic binder in a ball mill for four hours. The milled powder was passed through a 40-mesh sieve to adjust the grain size of the milled powder. The powder was then molded at a pressure of 1000 kgf/cm² into a disc 12.5 mm in diameter and 1 mm in thickness. The disc was fired at a temperature of 1100° C. to 1250° C. in the air to yield a ceramic disc. A silver paste was applied to and baked on surfaces of the ceramic disc (both principal planes) in a conventional manner to form silver electrodes. The ceramic disc was then subjected to a polarization treatment by the application of a direct-current voltage of 10 kV/mm for 10 to 30 minutes in a 150° C. to 200° C. insulating oil to yield a series of piezoelectric ceramics (samples).

Densities, temperature-dependent factors of resonant frequency frTC, and electromechanical coefficients kt of the above prepared samples were determined. The results are shown in Tables 1 to 3. Tables 1 to 3 also indicate the symbol of element M in the composition of each sample, the values of x/2, y and z, and the firing temperature. In Tables 1 to 3, the symbol "*" in the column of "Sample No." indicates that the sample in question is out of the scope of the present invention.

TABLE 1

| Sample No. | M | x/2 | y | z | Firing Temperature (° C.) | Density (g/cm²) | frTC (ppm/° C.) | kt (%) |
|---|---|---|---|---|---|---|---|---|
| 1* | — | 0 | 0 | 0 | 1250 | 7.00 | 32.8 | 10.4 |
| 2* | — | 0 | 0 | 0 | 1100 | 5.79 | not measurable | not polarizable |
| 3 | — | 0 | 0.1 | 0 | 1100 | 6.99 | 29.5 | 12.5 |
| 4 | — | 0 | 0.3 | 0 | 1100 | 6.85 | 29.1 | 11.0 |
| 5* | — | 0 | 0.35 | 0 | 1100 | 6.23 | not measurable | not polarizable |
| 6 | — | 0 | 0.1 | 0.5 | 1100 | 6.85 | 28.5 | 16.9 |
| 7 | — | 0 | 0.3 | 0.5 | 1100 | 6.85 | 28.1 | 13.5 |
| 8* | — | 0 | 0.35 | 0.5 | 1100 | 6.13 | 36.8 | 8.9 |
| 9 | — | 0 | 0.1 | 1.0 | 1100 | 6.98 | 29.5 | 16.2 |
| 10 | — | 0 | 0.3 | 1.0 | 1100 | 7.00 | 28.6 | 14.8 |
| 11* | — | 0 | 0.35 | 1.0 | 1100 | 5.66 | 28.3 | 5.5 |
| 12 | — | 0 | 0.1 | 1.1 | 1100 | 5.98 | 29.7 | 10.4 |
| 13* | Mg | 0.05 | 0 | 0.5 | 1100 | 6.01 | 35.8 | 8.9 |
| 14* | Mg | 0.15 | 0 | 0.5 | 1100 | 6.55 | 39.1 | 8.2 |
| 15 | Mg | 0.05 | 0.1 | 0.5 | 1100 | 7.01 | 28.5 | 18.5 |
| 16 | Mg | 0.15 | 0.1 | 0.5 | 1100 | 6.88 | 28.9 | 19.5 |
| 17 | Mg | 0.25 | 0.1 | 0.5 | 1100 | 6.89 | 29.1 | 18.3 |
| 18 | Mg | 0.3 | 0.1 | 0.5 | 1100 | 6.11 | 29.6 | 10.2 |
| 19 | Mg | 0.05 | 0.3 | 0.5 | 1100 | 7.03 | 29.2 | 15.9 |
| 20 | Mg | 0.15 | 0.3 | 0.5 | 1100 | 7.05 | 28.6 | 15.6 |
| 21 | Mg | 0.25 | 0.3 | 0.5 | 1100 | 6.85 | 28.4 | 15.7 |
| 22* | Mg | 0.05 | 0.35 | 0.5 | 1100 | 6.24 | 40.1 | 7.9 |
| 23* | Mg | 0.15 | 0.35 | 0.5 | 1100 | 6.25 | not measurable | not polarizable |
| 24* | Mg | 0.25 | 0.35 | 0.5 | 1100 | 6.31 | not measurable | not polarizable |
| 25 | Mg | 0.05 | 0.1 | 1.0 | 1100 | 7.01 | 30.0 | 17.7 |
| 26 | Mg | 0.15 | 0.1 | 1.0 | 1100 | 6.99 | 28.6 | 17.1 |
| 27 | Ca | 0.15 | 0.1 | 0.5 | 1100 | 7.04 | 28.5 | 18.1 |

TABLE 1-continued

| Sample No. | M | x/2 | y | z | Firing Temperature (° C.) | Density (g/cm²) | frTC (ppm/° C.) | kt (%) |
|---|---|---|---|---|---|---|---|---|
| 28 | Ca | 0.25 | 0.1 | 0.5 | 1100 | 6.98 | 28.7 | 19.1 |
| 29 | Ca | 0.15 | 0.3 | 0.5 | 1100 | 6.90 | 29.1 | 17.1 |
| 30 | Ca | 0.25 | 0.3 | 0.5 | 1100 | 6.98 | 28.7 | 16.5 |

TABLE 2

| Sample No. | M | x/2 | y | z | Firing Temperature (° C.) | Density (g/cm²) | frTC (ppm/° C.) | kt (%) |
|---|---|---|---|---|---|---|---|---|
| 31* | Ca | 0.15 | 0.35 | 0.5 | 1100 | 6.15 | 36.7 | 8.1 |
| 32* | Ca | 0.25 | 0.35 | 0.5 | 1100 | 6.02 | 39.1 | 7.4 |
| 33 | Ba | 0.15 | 0.1 | 0.5 | 1100 | 6.86 | 28.4 | 19.5 |
| 34 | Ba | 0.25 | 0.1 | 0.5 | 1100 | 6.87 | 28.9 | 19.4 |
| 35 | Ba | 0.15 | 0.3 | 0.5 | 1100 | 7.04 | 29.3 | 15.6 |
| 36 | Ba | 0.25 | 0.3 | 0.5 | 1100 | 7.04 | 29.1 | 15.1 |
| 37* | Ba | 0.15 | 0.35 | 0.5 | 1100 | 6.43 | 39.4 | 9.0 |
| 38* | Ba | 0.25 | 0.35 | 0.5 | 1100 | 6.24 | not measurable | not polarizable |
| 39* | La | 0.05 | 0 | 0.5 | 1100 | 6.22 | 33.9 | 9.1 |
| 40* | La | 0.1 | 0 | 0.5 | 1100 | 6.44 | 34.5 | 8.5 |
| 41 | La | 0.05 | 0.1 | 0.5 | 1100 | 6.95 | 27.5 | 18.6 |
| 42 | La | 0.1 | 0.1 | 0.5 | 1100 | 6.94 | 27.1 | 20.0 |
| 43 | La | 0.15 | 0.1 | 0.5 | 1100 | 6.87 | 26.9 | 18.4 |
| 44 | La | 0.2 | 0.1 | 0.5 | 1100 | 5.40 | 28.9 | 10.7 |
| 45 | La | 0.05 | 0.3 | 0.5 | 1100 | 6.87 | 26.5 | 16.4 |
| 46 | La | 0.1 | 0.3 | 0.5 | 1100 | 6.88 | 26.8 | 16.5 |
| 47 | La | 0.15 | 0.3 | 0.5 | 1100 | 6.85 | 26.2 | 17.1 |
| 48* | La | 0.05 | 0.35 | 0.5 | 1100 | 6.40 | 33.5 | 8.3 |
| 49* | La | 0.15 | 0.35 | 0.5 | 1100 | 6.35 | not measurable | not polarizable |
| 50 | La | 0.05 | 0.1 | 1.0 | 1100 | 6.98 | 26.8 | 18.5 |
| 51 | La | 0.15 | 0.1 | 1.0 | 1100 | 6.97 | 27.5 | 18.5 |
| 52 | Nd | 0.05 | 0.1 | 0.5 | 1100 | 6.99 | 25.4 | 19.3 |
| 53 | Nd | 0.15 | 0.1 | 0.5 | 1100 | 7.00 | 25.7 | 19.5 |
| 54 | Nd | 0.05 | 0.3 | 0.5 | 1100 | 6.85 | 25.4 | 19.4 |
| 55 | Nd | 0.15 | 0.3 | 0.5 | 1100 | 6.89 | 25.1 | 18.7 |
| 56* | Nd | 0.05 | 0.35 | 0.5 | 1100 | 6.31 | 33.0 | 9.0 |
| 57* | Nd | 0.15 | 0.35 | 0.5 | 1100 | 5.88 | 33.2 | 7.4 |
| 58 | Sm | 0.05 | 0.1 | 0.5 | 1100 | 6.91 | 27.8 | 17.5 |
| 59 | Sm | 0.15 | 0.1 | 0.5 | 1100 | 6.92 | 27.0 | 18.1 |
| 60 | Sm | 0.05 | 0.3 | 0.5 | 1100 | 6.96 | 26.8 | 18.8 |

TABLE 3

| Sample No. | M | x/2 | y | z | Firing Temperature (° C.) | Density (g/cm²) | frTC (ppm/° C.) | kt (%) |
|---|---|---|---|---|---|---|---|---|
| 61 | Sm | 0.15 | 0.3 | 0.5 | 1100 | 6.93 | 27.6 | 18.7 |
| 62* | Sm | 0.05 | 0.35 | 0.5 | 1100 | 6.34 | 31.0 | 8.5 |
| 63* | Sm | 0.15 | 0.35 | 0.5 | 1100 | 6.37 | 34.0 | 9.3 |
| 64 | Y | 0.05 | 0.1 | 0.5 | 1100 | 6.84 | 24.9 | 20.6 |
| 65 | Y | 0.15 | 0.1 | 0.5 | 1100 | 6.86 | 25.0 | 21.0 |
| 66 | Y | 0.05 | 0.3 | 0.5 | 1100 | 7.01 | 25.8 | 20.5 |
| 67 | Y | 0.15 | 0.3 | 0.5 | 1100 | 7.00 | 25.7 | 19.5 |
| 68* | Y | 0.05 | 0.35 | 0.5 | 1100 | 6.42 | 33.1 | 9.0 |
| 69* | Y | 0.15 | 0.35 | 0.5 | 1100 | 6.41 | not measurable | not polarizable |

One should note that a half of x in the formula, i.e., x/2 corresponds to the content (mol) of M relative to 1 mol of Bi, and y in the formula corresponds to the content (mol) of Si relative to 1 mol of Bi in Tables 1 to 3.

Tables 1 to 3 show the reasons why the proportional ranges of individual components are specified in the invention. Specifically, the range of y in the above formula is specified as $0<y\leq0.3$ in the present invention because if the content of y is less than this range, the composition cannot be sufficiently sintered at firing temperatures of 1100° C. or less and polarization cannot be achieved. In contrast, if the content of y exceeds the range, a practicable electromechanical coefficient kt cannot be significantly obtained.

When M is at least one selected from Mg, Ca and Ba, the range of a half of x, i.e., x/2 is specified as $0\leq x/2\leq0.25$ according to the invention. This is because when the content of M exceeds this range, the electromechanical coefficient kt is decreased as compared with compositions containing no M, and advantages of the incorporation of M cannot be significantly obtained.

When M is at least one selected from La, Nd, Sm and Y, the range of a half of x, i.e., x/2 is specified as $0\leq x/2\leq0.15$ according to the invention. This is because when the content of M exceeds this range, the electromechanical coefficient kt is decreased as compared with compositions containing no M, and advantages of the incorporation of M cannot be significantly obtained.

In the invention, the content of manganese should be preferably about 1.0% by weight or less in terms of $MnCO_3$. If the content of manganese exceeds this range, the electromechanical coefficient kt and temperature-dependent factor of resonant frequency frTC are decreased as compared with compositions containing no manganese, and advantages of the incorporation of manganese cannot be significantly obtained.

Tables 1 to 3 show that the samples according to the invented examples exhibit a practicable electromechanical coefficient kt even when fired at firing temperatures of 1100° C. or less.

Furthermore, Tables 1 to 3 show that when M is at least one selected from La, Nd, Sm and Y in the samples according to the invention, the resulting piezoelectric ceramic compositions have a practicable electromechanical coefficient kt even when fired at firing temperatures of 1100° C. or less, have a low temperature-dependent factor of resonant frequency frTC, and are useful as materials for piezoelectric ceramics.

When M is at least one of Nd and Y, the resulting piezoelectric ceramic compositions have an especially low temperature-dependent factor of resonant frequency frTC.

The compositions of the invented piezoelectric ceramic compositions are not limited to those in the above examples, and any compositions within the scope of the invention are effective.

The invented piezoelectric ceramic compositions mainly containing a component of the formula $SrBi_2Nb_2O_9$ only have to have the aforementioned composition basically, and constitutive elements may have some deviations in molar ratios.

Figure 2:
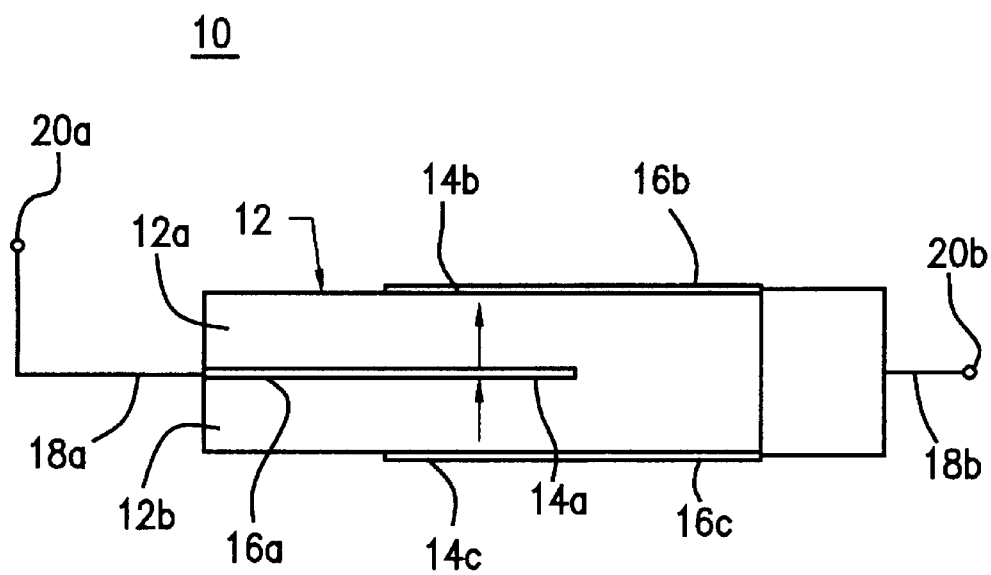
FIG. 2 is a sectional view illustrating the piezoelectric ceramic resonator shown in FIG. 1.

FIG. 1 is a perspective view of an embodiment of the invented piezoelectric ceramic resonator, and FIG. 2 is a sectional illustration of the piezoelectric ceramic resonator. A piezoelectric ceramic resonator 10 shown in FIGS. 1 and 2 includes a piezoelectric ceramic 12 of, for example, rectangular form. The piezoelectric ceramic 12 includes two piezoelectric ceramic layers 12a and 12b. These piezoelectric ceramic layers 12a and 12b are composed of the invented piezoelectric ceramic composition and are integrally formed by lamination. The piezoelectric ceramic layers 12a and 12b are polarized in the same thickness direction as indicted by the arrows in FIG. 2.

In the center between the piezoelectric ceramic layers 12a and 12b, a vibrating electrode 14a of, for example, round form is formed, and a leading electrode 16a in the shape of, for example, the letter T is formed extending from the vibrating electrode 14a to one end face of the piezoelectric ceramic 12. In the center of a surface of the piezoelectric ceramic layer 12a, a vibrating electrode 14b of, for example, round form is formed, and a leading electrode 16b in the shape of, for example, the letter T is formed extending from the vibrating electrode 14b to another end face of the piezoelectric ceramic 12. In the center of a surface of the piezoelectric ceramic layer 12b, a vibrating electrode 14c of, for example, round form is formed, and a leading electrode 16c in the shape of, for example, the letter T is formed extending from the vibrating electrode 14c to the other end face of the piezoelectric ceramic 12.

One outer electrode 20a is connected to the leading electrode 16a via a lead wire 18a, and the other outer electrode 20b is connected to the leading electrodes 16b and 16c via another lead wire 18b.

The present invention can be applied to, in addition to the aforementioned piezoelectric resonator 10, other piezoelectric ceramic resonators, piezoelectric ceramic filters, piezoelectric ceramic oscillators and other piezoelectric ceramic devices.

As thus described, the invention can provide piezoelectric ceramic compositions mainly containing $SrBi_2Nb_2O_9$ which can be fired at lower temperatures, exhibit a practicable electromechanical coefficient kt even when fired at firing temperatures of 1100° C. or less, and which are useful as materials for, for example, piezoelectric ceramic filters, piezoelectric ceramic oscillators, piezoelectric ceramic resonators and other piezoelectric ceramic devices, and can provide piezoelectric ceramic devices using the compositions.

Other embodiments and variations will be obvious to those skilled in the art, and this invention is not to be limited to the specific matters stated above.

What is claimed is:

1. A piezoelectric ceramic composition comprising a component corresponding to the formula $SrBi_2Nb_2O_9$ and further comprising Si in a proportion of more than 0 mol and equal to or less than about 0.3 mol per mol of Bi in said component of said formula.

2. A piezoelectric ceramic composition according to claim 1, comprising a component corresponding to the formula

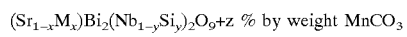

$(Sr_{1-x}M_x)Bi_2(Nb_{1-y}Si_y)_2O_9+z$ % by weight $MnCO_3$ wherein M is a divalent metallic element other than Sr and $0 \leq x \leq 0.5$ or a trivalent metallic element other than Bi and $0 \leq x \leq 0.3$, $0 < y \leq 0.3$ and $0 \leq z \leq 1$.

3. A piezoelectric ceramic composition according to claim 2, wherein x is 0, whereby a component corresponding to the formula $SrBi_2(Nb_{1-y}Si_y)_2O_9$ is present.

4. A piezoelectric ceramic composition according to claim 2, wherein x is greater than, 0 and M is a divalent metallic element other than Sr in a proportion of more than 0 mol and equal to or less than about 0.25 mol per mol of Bi.

5. A piezoelectric ceramic composition according to claim 4, wherein said divalent metallic element other than Sr is at least one element selected from the group consisting of Mg, Ca and Ba.

6. A piezoelectric ceramic composition according to claim 5, wherein z is greater than 0 and thus comprising manganese in an amount of more than 0% by weight and equal to or less than about 1.0% by weight as $MnCO_3$.

7. A piezoelectric ceramic composition according to claim 2, wherein x is greater than 0 and M is a trivalent metallic element other than Bi in a proportion of more than 0 mol and equal to or less than about 0.15 mol per mol of Bi.

8. A piezoelectric ceramic composition according to claim 7, wherein said trivalent metallic element other than Bi is at least one element selected from the group consisting of La, Ce, Pr, Nd, Sm, Gd, Dy, Er, Yb, Sc and Y.

9. A piezoelectric ceramic composition according to claim 7, wherein said trivalent metallic element other than Bi is at least one element selected from the group consisting of Nd and Y.

10. A piezoelectric ceramic composition according to claim 7, wherein z is greater than 0 and thus comprising manganese in an amount of more than 0% by weight and equal to or less than about 1.0% by weight as $MnCO_3$.

11. A piezoelectric ceramic composition according to claim 2, wherein $0.1 \leq y \leq 0.3$.

12. A piezoelectric ceramic composition according to claim 1, further comprising a divalent metallic element other than Sr in a proportion of more than 0 mol and equal to or less than about 0.25 mol per mol of Bi.

13. A piezoelectric ceramic composition according to claim 1, further comprising a trivalent metallic element other than Bi in a proportion of more than 0 mol and equal to or less than about 0.15 mol per mol of Bi.

14. A piezoelectric ceramic composition according to claim 1, further comprising manganese in a proportion of more than 0% by weight and equal to or less than about 1.0% by weight as $MnCO_3$.

15. A piezoelectric ceramic device comprising a piezoelectric ceramic according to claim 9, having an electrode connected thereto.

16. A piezoelectric ceramic device comprising a piezoelectric ceramic according to claim 7, having an electrode connected thereto.

17. A piezoelectric ceramic device comprising a piezoelectric ceramic according to claim 4 having an electrode connected thereto.

18. A piezoelectric ceramic device comprising a piezoelectric ceramic according to claim 3, having an electrode connected thereto.

19. A piezoelectric ceramic device comprising a piezoelectric ceramic according to claim 2, having an electrode connected thereto.

20. A piezoelectric ceramic device comprising a piezoelectric ceramic according to claim 1, having an electrode connected thereto.

* * * * *